United States Patent [19]

Koike et al.

[11] Patent Number: 4,514,766
[45] Date of Patent: Apr. 30, 1985

[54] SOLID-STATE IMAGING DEVICE

[75] Inventors: Norio Koike, Tokyo; Iwao Takemoto, Hinode; Shinya Ohba, Shiroyama; Toshiaki Masuhara, Hinode; Masaharu Kubo, Hachioji, all of Japan

[73] Assignee: Hitachi, Ltd., Tokyo, Japan

[21] Appl. No.: 482,791

[22] Filed: Apr. 7, 1983

[30] Foreign Application Priority Data

Apr. 7, 1982 [JP]  Japan .................................. 57-56607
Aug. 16, 1982 [JP] Japan .................................. 57-141115

[51] Int. Cl.³ .............................................. H04N 3/15
[52] U.S. Cl. .................................... 358/213; 358/212; 357/24; 357/30; 250/578
[58] Field of Search ....................... 358/209, 212, 213; 357/24 LR; 250/578, 211 J

[56] References Cited

U.S. PATENT DOCUMENTS 4,336,556  6/1982  Sekine et al. ........................ 358/213
4,392,158  7/1983  Aoki et al. .......................... 358/213

Primary Examiner—Gene Z. Rubinson
Assistant Examiner—Stephen Brinich
Attorney, Agent, or Firm—Antonelli, Terry & Wands

[57] ABSTRACT

A solid-state imaging device is provided which employs CCDs as vertical shift registers and a horizontal shift register for vertically and horizontally scanning and reading out a large number of photoelectric elements arrayed in a two-dimensional plane. The imaging device is characterized in that the photoelectric elements of each column arranged between the vertical shift registers are alternately connected to the right and left vertical shift registers. This results in the resolution of the device being enhanced sharply.

4 Claims, 10 Drawing Figures

SOLID-STATE IMAGING DEVICE

BACKGROUND OF THE INVENTION

The present invention relates to a solid-state imaging device in which photoelectric elements, and charge coupled devices (which will be referred to hereinafter as "CCDs") for reading out the optical information of the respective elements integrated on a semiconductor substrate.

A solid-state imaging device requires an imaging plate which possesses a resolution equivalent to that of an imaging electron tube used in television broadcasting at present. This necessitates a matrix of picture elements (photoelectric elements) which are arrayed in a number of about 500 in the vertical direction and in a number of about 800–1000 in the horizontal direction. Scanning elements are also required to correspond to the picture elements. Accordingly, the solid-state imaging device is fabricated by the use of the MOS large-scale integrated circuit technology capable of a high density of integration, and it generally employs CCDs or MOS transistors as its constituents.

FIG. 1 shows the fundamental arrangement of a CCD type solid-state imaging device which features low noise. Numeral 1 designates a photoelectric element which is constructed of, for example, a photodiode. Numerals 2 and 3 designate a vertical CCD shift register and a horizontal shift register, respectively, for delivering photo signals stored in the group of photoelectric elements, to an output end 4. Shown at numerals 5 and 6 are clock pulse generators which produce clock pulses for driving the vertical shift register and the horizontal shift register, respectively. Although clock pulse generators having two phases are illustrated here, either three phase or four phase clock systems may be adopted as well. In addition, numeral 7 indicates a transfer gate by which charges stored in the photodiode are fed into the vertical shift register 2. The present device serves as a black-and-white imaging device in the form illustrated in FIG. 1. When color filters are stacked thereon, it serves as a color imaging device because the respective photodiodes possess color information.

As is well known, in comparison with the electron tube, the solid-state imaging device has a large number of merits owing to its solid state nature, such as small size, light weight, freedom from maintenance and low power dissipation, and it is expected to be a very popular future imaging device. The solid-state device, however, involves the problem that the number of picture elements is still small, so the resolution is relatively low. As described before, the existing device is fabricated with the MOS integrated circuit technology. Nevertheless, the number of picture elements is only about 500 (in the vertical direction)×400 (in the horizontal direction). Moreover, with regard to interlacing, restrictions in the construction of the vertical shift register make it inevitable to adopt a system wherein odd-numbered rows (arrows 7-1 in solid are read out in the first field, while even-numbered rows (arrows 7-2 in dotted lines) are read out in the second field. Therefore, the solid-state device involves such problems attributed to the interlacing system that 50% of the charges stored in the preceding field remain (afterimage) and that the color resolution is low.

SUMMARY OF THE INVENTION

An object of the present invention is to solve the problems described above, that is, to enhance the resolution of a CCD type solid-state imaging device by contriving the arrangement of elements without resorting to the MOS integrated circuit technology.

In order to accomplish this and other objects, the present invention consists of installing a vertical CCD shift register at the center of each single photodiode, that is, arranging parts of each single photodiode in bilateral symmetry with a vertical CCD shift register interposed therebetween, whereby enhancement in resolution is, in effect, attained.

DETAILED DESCRIPTION OF THE PREFERRED EMBODIMENTS

Figure 1:
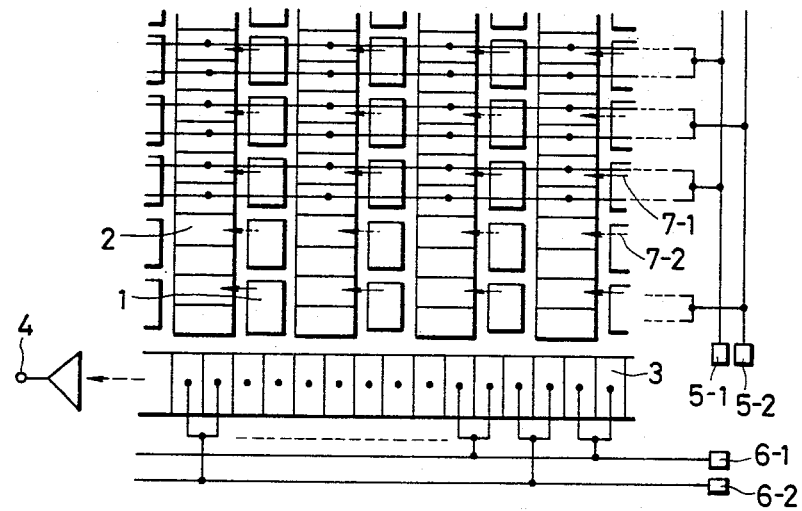
FIG. 1 is a diagram showing the fundamental arrangement of a CCD type solid-state imaging device used in a prior art arrangement.
Figure 2:
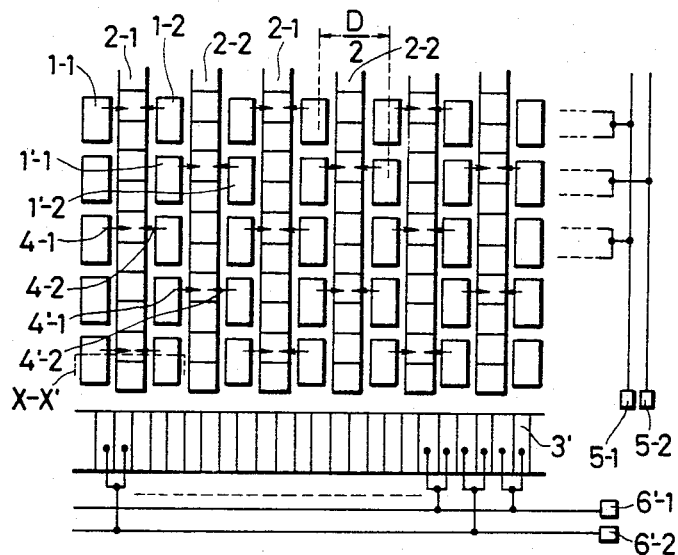
FIG. 2 is a diagram showing the arrangement of a CCD type imaging device according to the present invention.

Now, the present invention will be described in detail in conjunction with embodiments. FIG. 2 is a diagram showing the fundamental arrangement of a CCD type solid-state imaging device according to the present invention. Photoelectric elements 1-1 and 1-2 in the first row (odd-numbered row) are a group of photodiodes which are bilaterally arranged with a vertical CCD shift register 2-1 interposed therebetween. Photoelectric elements 1'-1 and 1'-2 in the second row (even-numbered row) are a group of photodiodes which are arranged in a manner to be staggered from the photoelectric elements 1-2 and 1-2 by ½ picture element (D/2) in the horizontal direction, and between which a vertical CCD shift register 2-2 is similarly interposed. Symbols 4-1, 4-2, 4'-1 and '-2 denote transfer gates by which signal charges stored in the photodiodes are fed into the corresponding vertical shift registers. Here, the signal charges of the bilaterally divided photodiodes 1-1 and 1-2 (or 1'-1 and 1'-2) are collected to the vertical shift register 2-1 (or 2-2) through the respective transfer gates 4-1 and 4-2 (or 4'-1 and 4'-2), to become signals which are not distinguished from one another. Therefore, each pair of the elements 1-1 and 1-2 (or 1'-1 and 1'-2) is to be regarded as forming a single photodiode. (That is, it may be considered that, in the present invention, each diode in the prior-art example (FIG. 1) is divided into halves, which are arranged bilaterally of the vertical shift register.) In addition, numerals 5-1 and 5-2 indicate a clock pulse generator for driving the vertical shift registers, and numerals 6'-1 and 6'-2 indicate a clock pulse generator for driving a horizontal shift register 3'. Although it has not been shown to avoid undue complexity in the drawings, it is to be understood that the clock pulse generators 5-1 and 5-2 are coupled to the shift registers 2-1 and 2-2 to effect the transfer of charges from the photodiodes to the vertical shift registers and shifting of the signals along the vertical shift registers, as will be described hereinafter. Here, in the arrangement of the device of the present invention, the vertical shift registers are so arrayed that the number thereof per horizontal pitch of the picture elements is larger by one than in the case of the prior-art device (FIG. 1). Therefore, the constituent electrodes of the horizontal shift register double in number. (In other words, the pitch size of the horizontal register is reduced to half of that of the horizontal register in FIG. 1.) An output end 4 is provided at the output of the horizontal shift register 3' in FIG. 2 similar to FIG. 1.

Figure 3A:
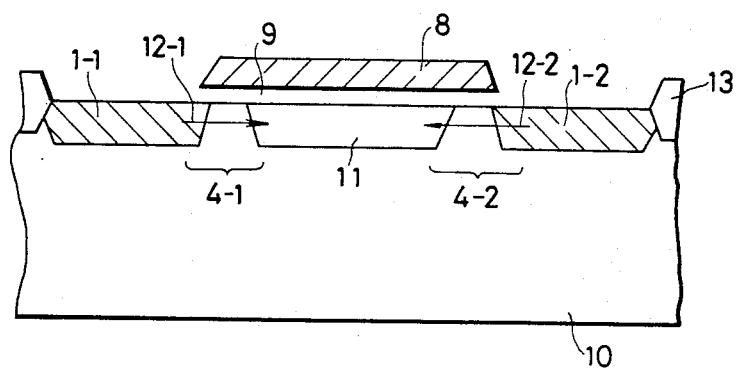
FIGS. 3(a) and 3(b) are diagrams showing the sectional structure and plan layout of the imaging device of the present invention illustrated in FIG. 2, respectively.
Figure 3B:
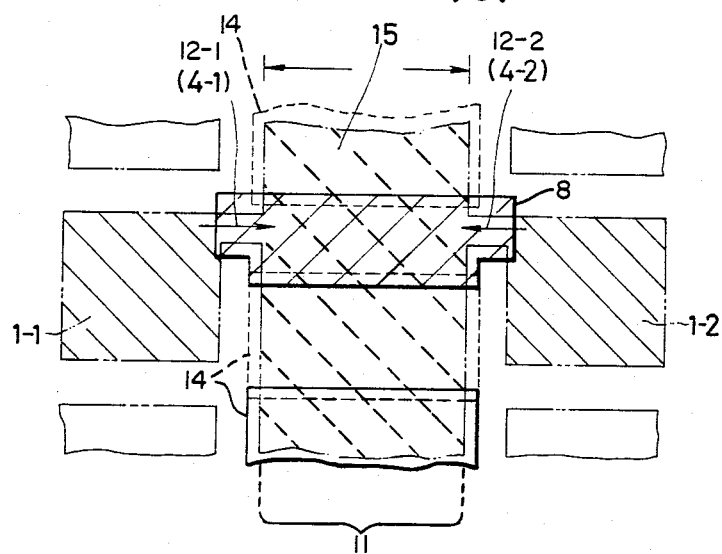

FIGS. 3(a) and 3(b) are diagrams which exemplify the sectional structure and plan layout of the imaging device of the present invention shown in FIG. 2. FIG. 3(a) shows the device structure taken along the section X—X' of one picture element in FIG. 2. Numeral 8 designates a CCD electrode (usually, made of polycrystalline silicon) which constitutes the vertical shift register and which serves also as the transfer gate 4, numeral 9 a gate oxide film (usually, made of SiO$_2$) which electrically insulates the electrode 8 and a semiconductor substrate 10, symbols 1-1 and 1-2 the elements of the photodiode, and numeral 11 an impurity layer (made of impurity atoms having a conductivity type opposite to that of the substrate and a comparatively low impurity density) which forms the buried channel of the vertical shift register. When a high voltage is applied to the electrode 8, the charges of the elements of the photodiode are fed into the vertical shift register (namely, into the channel 11) through the transfer gate regions 4-1 and 4-2 (as indicated by arrows 12-1 and 12-2). In addition, numeral 13 indicates a thick insulating oxide film (usually, made of SiO$_2$) which isolates the respectively adjacent picture elements.

FIG. 3(b) shows an example of the plan layout of the aforementioned picture element. Numeral 8 denotes the CCD electrode (indicated by a solid line), symbols 4-1 and 4-2 the transfer gate regions which are formed by extending parts of the electrode 8 to the photodiode sides, numeral 14 another CCD electrode (indicated by a dotted line) which constitutes the vertical shift register 2-1 (and which is formed of a first layer of polycrystalline silicon when the electrode 8 is formed of a second layer of polycrystalline silicon), and numeral 15 a channel region formed by impurity layer 11 (shown in FIG. 3b by the oblique dashed lines) through which the charges are transported.

Figure 4:
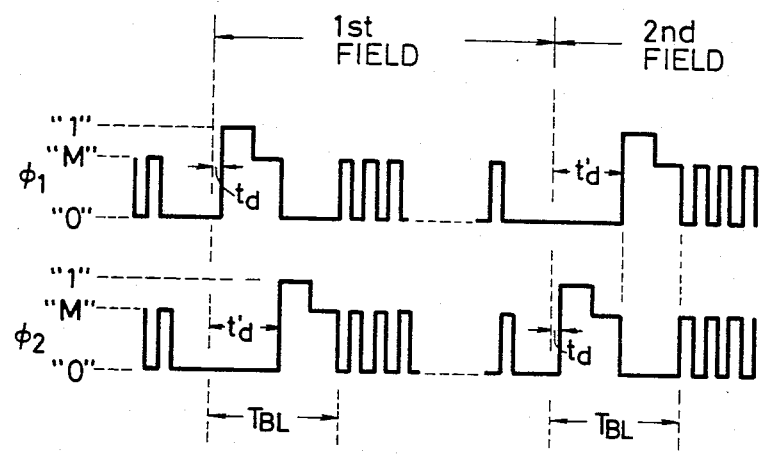
FIG. 4 is a diagram showing a pulse time chart for driving the imaging device of the present invention illustrated in FIG. 2.

FIG. 4 shows clock pulses for driving the vertical shift register in the imaging device of the present invention in FIG. 2, and the timings thereof. $\phi_1$ represents pulses from the clock pulse generator 5-1 while $\phi_2$ represents pulses from the clock pulse generator 5-2. The pulses include the three levels of "1", "M" and "0". The "1" level (the highest voltage) indicates the state in which the transfer gate 8 is enabled (the state in which the charges of the photodiode can be fed into the vertical shift register). The level "M" (a medium voltage) is a voltage which drives the vertical shift register. The level "1" and the level "0" (for example, the ground voltage) are alternately applied to the CCD electrodes constituting the vertical shift register, whereby the signal charges are successively shifted toward the horizontal register (downwards) within the vertical register. Here, the level "1" and the level "M" succeeding thereto are received within a vertical blanking time ($T_{BL}$) in both the pulse trains. However, in the first field, the level "1" of the clock pulse train $\phi_1$ is provided a predetermined period of time ($t_d'-t_d$) earlier than the level "1" of the clock pulse train $\phi_2$, whereas in the second field, the level "1" of $\phi_2$ is provided earlier than that of $\phi_1$. In this manner, the pulse trains $\phi_1$ and $\phi_2$ both of which have the levels "1" within each field and in which the output times of the levels "1" are inverted every field are impressed on the imaging device of the present invention, whereby the signal charges of the photodiodes in two rows which are staggered one row every field are permitted to be read out. More specifically, by way of example, in the first field, the photodiodes of the (n−1)-th row (1-1, 1-2) are selected by the pulse $\phi_1$ and the photodiodes of the n-th row (1'-1, 1'-2) by the pulse $\phi_2$, and all the signal charges of the respective rows fed into the vertical registers are shifted or held under the CCD electrodes of the n-th row constituting the vertical registers (2-1, 2-2), while in the second field, the photodiodes of the n-th row (1'1, 1'-2) are selected by the pulse $\phi_2$ and the photodiodes of the (n+1)-th row (1-1, 1-2) by the pulse $\phi_1$, and the signal charges are shifted or held under the CCD electrodes of the (n+1)-th row constituting the vertical registers (2-1, 2-2). In this way, the signals of the adjacent rows in the same column are shifted within the respective vertical registers at the same time until they are finally shifted into the horizontal shift register. The times at which the signal charges of the respective rows are shifted into the horizontal shift register are coincident. Since, however, the signal charges of the (n−1)-th row (or the n-th row) are shifted to stages of the horizontal shift register 3' preceding by one bit (i.e. stages closer to the output 4) with respect to the stages into which the charges of the n-th row (or (n+1)-th row) are shifted, the output 4 can be supplied with the signal charges in the order of the (n−1)-th row and the n-th row in the first field and in the order of the n-th row and the (n+1)-th row in the second field. The fact that, in this manner, the signals of the adjacent rows are shifted at the same time within the vertical register and with a predetermined time lag (which is determined by the drive frequency of the horizontal register per stage) within the horizontal register, makes signal processing (the separation of the signals of the adjacent rows) very simple. (In other words, even in the imaging device of the present invention in which two rows are simultaneously read out, the signal processing can be performed in quite the same form as in the prior-art device of FIG. 1 in which one row is read out at a time).

As a result, in the imaging device of the present invention, the signals of the photodiodes which are so arrayed as to be spacially staggered by $\frac{1}{2}$ picture element in the horizontal direction every row are read out with the two rows as one set, whereby enhancements in resolution can be achieved in both the horizontal and vertical directions. When the inventors calculated the resolution as to the imaging device of the arrangement in the present invention, it has been found that a resolution is attained which is about 1.8 times higher than in the device of the arrangement in the prior art. The fact that the enhancement of the resolution can be realized by altering the arrayal of picture elements as described above with the number of the picture elements held equal to that in the prior-art device, is greatly valuable in practical use for present-day solid-state imaging devices in which the density of integration of picture elements is subject to an upper limit on account of the restrictions of techniques for fabricating the devices.

Figure 5:
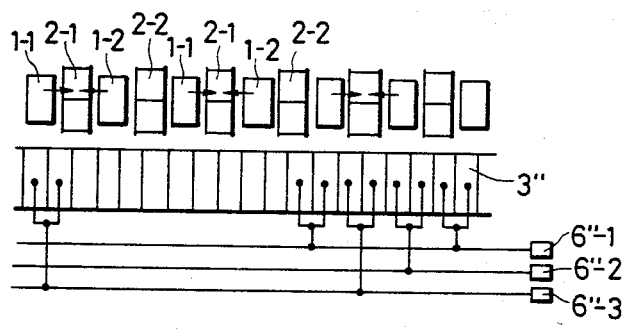
FIGS. 5 and 6 are diagrams each showing an embodiment in the case where the arrangement of horizontal CCD shift registers differ from that in FIG. 2.
Figure 6:
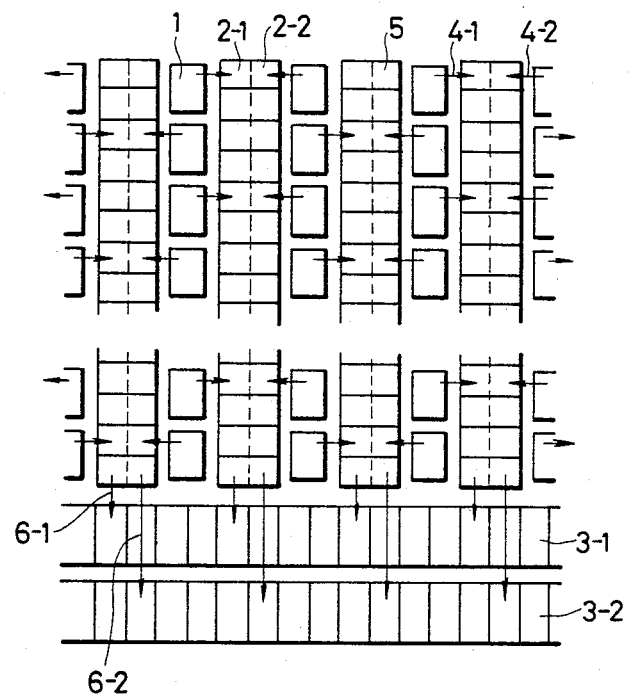

While, in the above embodiment, it has been considered to drive both the vertical and horizontal registers with the commonly used two-phase clock pulses, they may well be driven with three phase clock pulses or four-phase clock pulses. FIG. 5 illustrates a case where vertical registers are driven with the same two-phase clock pulses as in FIG. 2, while a horizontal register is driven with three-phase clock pulses. Here, the drive with the three-phase clock pulses can reduce the number of constituent electrodes of the horizontal register to ⅔ of that in the case of FIG. 2, which brings forth the advantage that the design and fabrication of the device are facilitated. Further, by installing two two-phase clock type horizontal registers as shown in FIG. 6, signal charges from the vertical register 2-1 for reading out the signals of the photoelectric elements in odd-numbered rows can be shifted by the horizontal register 3-1 (arrow 6-1), and signal charges from the vertical register 2-2 for reading out the signals of the photoelectric elements in even-numbered rows can be shifted by the horizontal register 3-2 (arrow 6-2). In this case, the pitch size of the CCD electrodes of each horizontal register may be equal to that in the case of the prior-art device in FIG. 2, so that the fabrication of the device is facilitated more.

Figure 7:
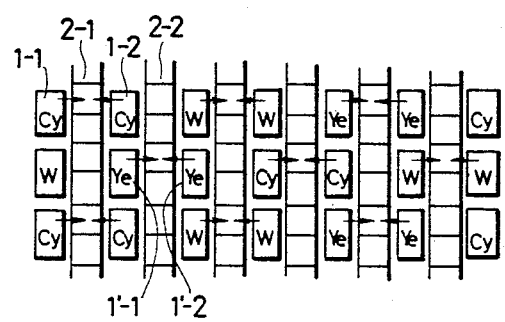
FIG. 7 is a diagram showing the arrangement of a color CCD type imaging device according to the present invention in which color filters are stacked.

While the above description has been directed toward black-and-white imaging devices for simplicity of the explanation, the arrangement and operation in the case of a color device are quite the same as in the case of the foregoing imaging devices. By way of example, regarding the arrangement of a device which employs complementary color filters, the correspondence of colors is illustrated in FIG. 7. While photoelectric elements 1-1 and 1-2 or those 1'-1 and 1'-2 are divided halves, they form a single photodiode as stated before. Therefore, by way of example, the row (1-1, 1-2) has cyan filters, while filters and yellow filters allotted thereto from the left to the right, while the row (1'-1, 1'-2) has yellow filters, cyan filters and white filters allotted thereto in such a manner that these filters are staggered by ½ picture element from the filters of the preceding row.

Figure 8:
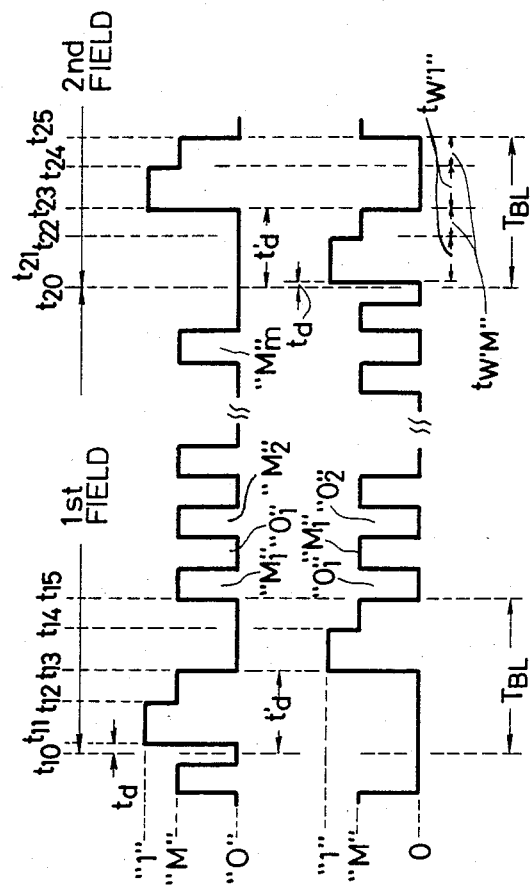
FIG. 8 is a diagram showing the driving system of the device in FIG. 6.

FIG. 8 shows a time chart of clock pulses in the present invention for driving the device shown in FIG. 6.

$\phi_1$ indicates a first clock pulse train for driving the vertical CCD shift register, and $\phi_2$ a second clock pulse train differing in phase from the first clock pulse train $\phi_1$.

Figure 9:
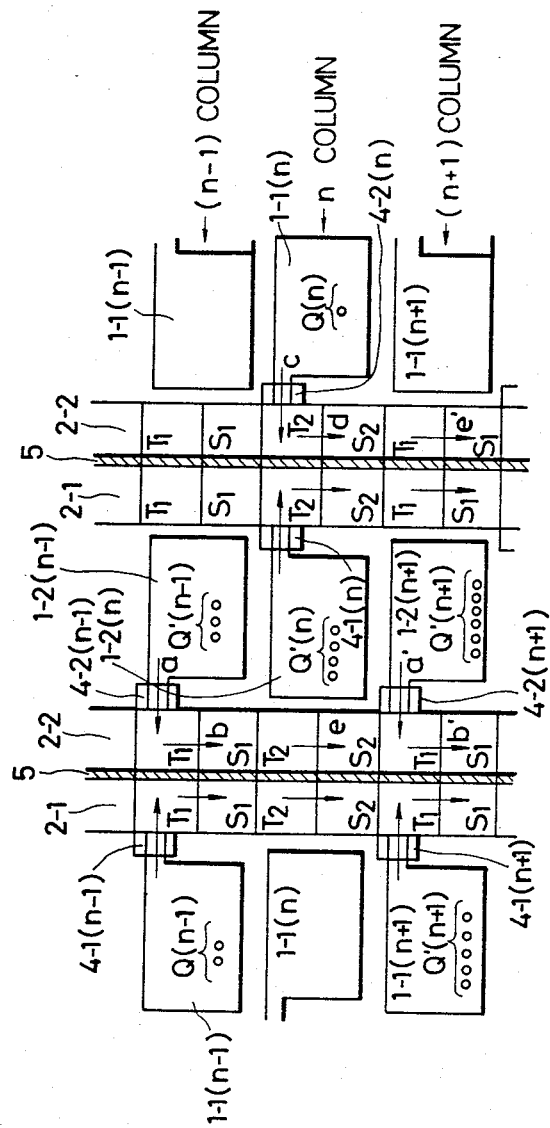
FIG. 9 is a diagram showing an example of the plan layout of the arrangement shown in FIG. 6.

FIG. 9 shows the plan layout of the present invention for the device arrangement shown in FIG. 6. Symbols 2-1 and 2-2 denote the CCD vertical shift registers, the electrical insulation of which is effected by an isolation band 5 (for example, formed of an impurity having the same conductivity type as that of a substrate and a high density). Symbols 4-1 and 4-2 denote transfer gate regions by which photo signal charges stored in photodiodes are fed into the shift registers 2-1 and 2-2 during one field period. In addition, both the shift registers (2-1, 2-2) are constructed of storage electrodes $S_1$ and transfer electrodes $T_1$ on which the clock pulses $\phi_1$ are impressed, and storage electrodes $S_2$ and transfer electrodes $T_2$ on which the clock pulses $\phi_2$ are impressed.

Now, the operation of signal charge transfer will be described with reference to FIGS. 8 and 9. The starting point of the first field is presumed to be a time $t_{10}$, and that of the second field is presumed to be a time $t_{20}$. In the first field, it is assumed that the level "1" of the clock pulse train $\phi_1$ is generated with a predetermined time delay $t_d$ from the starting time $t_{10}$, and that the level "1" of the clock pulse train $\phi_2$ is generated with a time delay $t'_d$ from the starting time $t_{10}$. Conversely, in the second field, it is assumed that the level "1" of the clock pulse train $\phi_2$ is generated with the predetermined time delay $t_d$ from the starting time $t_{20}$, and that the level "1" of the clock pulse train $\phi_1$ is generated with the time delay $t'_d$ from the starting time $t_{20}$. Here, the durations (pulse widths) of the level "1" of the clock pulses and the levels "M" and "0" subsequent to the level "1" may be set at any values in a range in which the total time interval thereof becomes shorter than a vertical blanking time $T_{BL} \approx 2.7$ msec) provided every field. The total time interval $T_w$ of the pulse widths is expressed by the following equation:

$$T_w = 2 \cdot (t_{w\text{"}1\text{"}} + t_{w\text{"}M\text{"}}) + t_d \qquad (1)$$

In both the clock pulse trains $\phi_1$ and $\phi_2$, pulses "M", "$0_1$", "$M_2$", "$0_2$", ... "$M_m$" and "$0_m$" of the repeated levels "M" and "0" succeeding to the vertical blanking times $T_{BL}$ are pulses for driving the vertical CCD shift registers. Usually, the repetition frequency of "M" and "0" is 15.7 kHz. Let it be supposed that the clock pulses $\phi_1$ are impressed on the storage electrodes $S_1$ and transfer electrodes $T_1$ constituting the vetical CCD shift registers, and that the clock pulses $\phi_2$ are impressed on the other sets of electrodes $S_2$ and $T_2$.

Referring to FIGS. 8 and 9, when the level "1" of the clock pulse $\phi_1$ is applied to the transfer gates 4-1 (n−1), 4-2 (n−1) and the electrodes $T_1$, $S_1$ at a time $t_{11}$ in the first field, photo signal charges $Q(n-1)$, $Q'(n-1)$ stored in the photodiodes 1-1 (n−1) and 1-2 (n−1) of the (n−1)-th row during the period of one field are fed into the electrodes $T_1$ of the vertical CCD shift registers 2-1, 2-2 through the transfer gates 4-1 (n−1) 4-2 (n−1) in the period ($t_{11}$–$t_{12}$) of the level "1" (step a). Further, the charges flow into the electrodes $S_1$ lower in potential than the electrodes $T_1$ in a period $t_{11}$–$t_{13}$ (step b). Here, the higher and lower potentials are established in such a way that, in a process for fabricating the device, an impurity which is the same as that contained in the substrate and higher in density than in the substrate is ion-implanted into the surface of the semiconductor substrate under the electrodes $T_1$, $T_2$ by way of example, thereby to make the potentials of the electrodes $T_1$, $T_2$ higher than those of the electrodes $S_1$, $S_2$ respectively.

Next, when the level "1" of the clock pulse $\phi_2$ is applied to the transfer gates 4-1 (n), 4-2 (n) and the electrodes $T_2$, $S_2$ at the timing $t_{13}$, photo signal charges $Q'(n)$, $Q(n)$ stored in the photodiodes 1-2 (n), 1-1 (n) of the n-th row are fed into the transfer electrodes $T_2$ of the vertical CCD shift registers 2-1, 2-2 through the transfer gates 4-1 (n), 4-2 (n) in the period ($t_{13}$–$t_{14}$) of the level "1" (step c). Further, the charges flow into the electrodes $S_2$ lower in potential than the electrodes $T_2$ in a period $t_{14}$–$t_{15}$ (step d).

On the other hand, the clock pulses (which are negative) for the electrodes $T_1$, $S_1$ are caused to fall from the level "M" to the level "0" at the time $t_{13}$, while at the same time $t_{13}$ the clock pulses of the level "1" are impressed on the adjacent electrodes $T_2$, $S_2$ (of the n-th row). Therefore, the n-th row becomes lower in potential than the (n−1)-th row, the charges Q(n−1), Q'(n−1) of the photodiodes 1-1 (n−1), 1-2 (n−1) having been temporarily stored under the electrodes $S_1$ of the vertical CCD shift registers on the left shift under the electrodes $T_2$ of the lower potential and then flow under the electrodes $S_2$ of the still lower potential (step e). The period of time during which the charges flow in is $t_{13}$–$t_{15}$.

As understood from the above description, the shift e and the shift d are performed in substantially the same time intervals ($t_{13}$–$t_{15}$ and $t_{14}$–$t_{15}$) and are completed at the same time ($t_{15}$). As a result, the signals of the photodiodes of the (n−1)-th row and n-th row are arrayed under the electrodes $S_2$ of the identical row (n). When the charge transferring clocks "$M_1$"·"$0_1$", "$M_2$"·"$0_2$". . . are applied to the respective electrodes in the vertical CCD shift registers at the time $t_{15}$, the photodiode signal charges of the adjacent two rows of the (n−1)-th row and the n-th row are fed to the (n+1)-th row, the (n+2)-th row . . . at the same times until they are simultaneously fed into the horizontal CCD shift registers which are disposed below the last row. Here, by way of example, the signal charges of the (n−1)-th row (even-numbered rows) are fed into the horizontal CCD shift register 3-1 (FIG. 6), and the signal charges of the n-th row (odd-numbered rows) into the horizontal register 3-2. Thereafter, the signal charges of all the photodiodes in the adjacent two columns (n−1, n) are shifted to the electrodes of the same columns at the same times within the respective horizontal CCD shift registers. Accordingly, the signal charges of the photodiodes of the respectively adjacent rows can be provided at the outputs of the respective horizontal CCD shift registers at the same times. The above series of operations proceed simultaneously for the respective columns. Further, owing to the arrangement of the checkered pattern, the charges of the even-numbered rows enter the horizontal CCD shift register 3-1 and those of the odd-numbered rows enter the horizontal register 3-2, by way of example.

On the other hand, in the second field, conversely to the case of the first field, the level "1" of the clock pulse $\phi_2$ is applied to the respective electrodes first (at a time $t_{21}$), and the level "1" of the clock pulse $\phi_1$ is applied thereto subsequently (at $t_{23}$). As a result, photo signal charges stored in the photodiodes 1-2 (n), 1-1 (n) of the n-th row (these charges are separate from the charges in the first field, the latter having already been fed into the horizontal CCD shift registers by the transferring clocks "$M_1$"·"$0_1$", "$M_2$"·"$0_2$", . . . and "$M_m$"·"$0_m$" before the period $t_{21}$–$t_{23}$) flow under the electrodes $S_2$ in the period $t_{21}$–$t_{23}$ (the shifting operations are denoted by the same symbols c and d as in the case of the first field). Next, since the level "1" of the clock pulse $\phi_1$ is applied at the time $t_{23}$, the signal charges Q(n+1), Q'(n+1) of the photodiodes of the (n+1)-th row flow under the electrodes $S_1$ of the (n+1)-th row in a period $t_{23}$–$t_{25}$ (a', b'). At the same time $t_{23}$, the level "M" of the clock pulse $\phi_2$ (negative pulse) is caused to fall to the level "0". Since, at this time, the potentials of the clocks $\phi_1$ impressed on the (n+1)-th row are "1" and "M" the (n+1)-th row becomes lower in potential than the n-th row, and the charges having been temporarily stored under the electrodes $S_2$ of the n-th row in the vertical CCD shift registers on the right are transferred under the electrodes $S_1$ of the (n+1)-th row (step e'). In the second field, consequently, the signal charges of the photodiodes of the n-th row and the (n+1)-th row are arrayed under the electrodes $S_1$ of the (n+1)-th row. These charges are fed to the (n+2)-th row, the (n+3)-th row, . . . at the same times when the transferring clock pulses "$M_1$"·"$0_1$", "$M_2$"·"$0_2$". . . and "$M_m$"·"$0_m$" starting at the time $t_{25}$ are successively impressed on the respective electrodes of the vertical CCD shift registers. By way of example, the signal charges of the n-th row (odd-numbered rows) are fed into the horizontal CCD shift register 3-1 (FIG. 6), and the signal charges of the (n+1)-th row (even-numbered rows) into the horizontal CCD shift register 3-2.

According to the device driving system thus far described, in the first field, the signal charges of the photodiodes of the two adjacent rows (n−1, n) are read out as one set, while in the second field, the signal charges of the two rows (n, n+1) staggered one row from those of the first field can be read out as one set. In addition, as stated before, in the signal charges of the two rows (n−1, n) transferred in the first field, those of the (n−1)-th row (even-numbered rows) are fed into the horizontal CCD shift register (3-1), and those of the n-th row (odd-numbered rows) into the register (3-2), while in the signal charges of the two rows (n, n+1) transferred in the second field, those of the n-th row (odd-numbered rows) are fed into the horizontal CCD shift register (3-1), and those of the (n+1)-th row (even-numbered rows) into the register (3-2). As a result, the signal charges of all rows are delivered to the respective horizontal CCD shift registers (3-1, 3-2). That is, by adopting the driving system of the present invention, it becomes possible to actually drive a device provided with a plurality of vertical CCD shift registers (and further, horizontal CCD shift registers) as shown in FIG. 6.

As explained above in conjunction with the embodiments, according to the present invention, photodiodes are staggered by ½ picture element dimension every row, and the signals of the respective diodes are read out by the interlacing system of simultaneously selecting two rows, whereby the resolution can be enhanced to approximately double that previously obtainable. Further, owing to the two-row selection into which the interlacing of one-row selection performed in the prior-art CCD device is altered, it is possible to realize the prevention of the appearance of an afterimage, the prevention of the occurrence of color mixture, the simplification of a signal processing circuit, etc. Thus, the practical value of the present invention is very high.

In addition, according to the driving method of the present invention, a CCD type solid-state imaging device which includes an interlacing system for scanning one set of photoelectric elements staggered by one row every field can be actually driven. As a result, the occurrence of a field afterimage which was a significant problem of the prior-art device can be prevented. Also, in a color device, it is possible to realize a significant enhancement of the resolution along with the prevention of the occurrence of color mixture, etc. Thus, remarkable improvements in the picture quality can be achieved.

It is to be understood that the above-described arrangements are simply illustrative of the application of the principles of this invention. Numerous other arrangements may be readily devised by those skilled in the art which embody the principles of the invention and fall within its spirit and scope.

We claim:

1. In a solid-state imaging device having a plurality of photoelectric elements which are disposed on a semiconductor substrate in rows and columns and which convert optical information into electric signals, and a plurality of vertical CCD shift registers and a horizontal CCD shift register which successively shift the electric signals in vertical and horizontal directions; a solid-state imaging device characterized in that said vertical CCD shift registers are allotted to said photoelectric elements of respective columns, and that the photoelectric elements of each column are alternatively connected to left and right vertical CCD shift registers, whereby said electric signals of said photoelectric elements of even-numbered rows and odd-numbered rows are separately delivered to said vertical CCD shift registers.

2. A solid-state imaging device according to claim 1, characterized in that outputs of said vertical CCD shift registers of the respective columns are successively delivered to those positions of said horizontal CCD shift register which correspond to said respective columns.

3. A solid-state imaging device according to claim 1, characterized in that said horizontal CCD shift register includes a first horizontal CCD shift register which shifts outputs of the vertical CCD shift registers for shifting the signals of said photoelectric elements of said odd-numbered rows, and a second horizontal CCD shift register which shifts outputs of the vertical shift registers for shifting the signals of said photoelectric elements of said even-numbered rows.

4. In a CCD type solid-state imaging device in which photoelectric elements for deriving optical information, a plurality of vertical CCD shift registers for successively shifting photo signal charges stored in the elements, transfer gates for connecting the photoelectric elements and the vertical shift registers, and at least one horizontal CCD shift register are integrated on an identical semiconductor substrate, and which utilizes an interlacing system of scanning one set of two rows staggered by one row every field; a method of driving a solid-state imaging device characterized in that first and second enabling pulses are provided in a vertical blanking time, and that said first pulse has no time delay in a first field and is delayed by a width of said second pulse relative to said second pulse in a second field, while said second pulse is delayed by a pulse width of said first pulse relative to said first pulse in said first field and has no time delay in said second field, whereby said transfer gates are enabled by both said pulses so as to successively shift the signal charges.

* * * * *